United States Patent
Higashi et al.

(10) Patent No.: US 8,795,435 B2
(45) Date of Patent: Aug. 5, 2014

(54) SUSCEPTOR, COATING APPARATUS AND COATING METHOD USING THE SUSCEPTOR

(75) Inventors: Shinya Higashi, Kanagawa (JP); Hironobu Hirata, Shizuoka (JP)

(73) Assignees: Kabushiki Kaisha Toshiba, Tokyo (JP); NuFlare Technology, Inc., Numazu-shi, Shizuoka (JP)

(*) Notice: Subject to any disclaimer, the term of this patent is extended or adjusted under 35 U.S.C. 154(b) by 652 days.

(21) Appl. No.: 12/828,963

(22) Filed: Jul. 1, 2010

(65) Prior Publication Data

US 2011/0171380 A1 Jul. 14, 2011

(30) Foreign Application Priority Data

Jul. 1, 2009 (JP) ................. 2009-156809

(51) Int. Cl.
 *C23C 16/00* (2006.01)
 *C23C 16/458* (2006.01)
 *C23C 16/46* (2006.01)

(52) U.S. Cl.
 USPC .......... 118/725; 118/58; 118/723 E; 118/728; 118/724; 118/730; 269/302; 156/345.51

(58) Field of Classification Search
 USPC ............... 118/728, 725, 724, 730, 723 E, 58; 156/345.51; 269/302
 See application file for complete search history.

(56) References Cited

U.S. PATENT DOCUMENTS

| | | | |
|---|---|---|---|
| 5,474,612 A | 12/1995 | Sato et al. | |
| 5,584,936 A * | 12/1996 | Pickering et al. | 118/728 |
| 2004/0144323 A1 | 7/2004 | Kai | |
| 2009/0068851 A1 * | 3/2009 | Hirata et al. | 438/778 |
| 2009/0139448 A1 * | 6/2009 | Hirata et al. | 117/107 |
| 2009/0194018 A1 * | 8/2009 | Higashi et al. | 117/98 |
| 2011/0120366 A1 * | 5/2011 | Higashi et al. | 117/94 |
| 2011/0171380 A1 * | 7/2011 | Higashi et al. | 427/248.1 |
| 2012/0055406 A1 | 3/2012 | Hirata et al. | |

FOREIGN PATENT DOCUMENTS

| | | |
|---|---|---|
| JP | 4-211117 | 8/1992 |
| JP | 5-152207 | 6/1993 |
| JP | 9-186227 | 7/1997 |

(Continued)

OTHER PUBLICATIONS

Notification of Reasons for Refusal issued by the Korean Patent Office on Aug. 29, 2011, for Korean Patent Application No. 2010-61860, and English-language translation thereof.

(Continued)

*Primary Examiner* — Sylvia R MacArthur
(74) *Attorney, Agent, or Firm* — Finnegan, Henderson, Farabow, Garrett & Dunner, L.L.P.

(57) ABSTRACT

In accordance with the embodiment of the present invention, there is provided a susceptor which includes an annular first susceptor portion for supporting the peripheral portion of a silicon wafer and further includes a second susceptor portion provided in contact with the peripheral portion of the first susceptor portion and covering the opening of the first susceptor portion. The second susceptor portion is disposed so that, when the silicon wafer is supported on the first susceptor portion, a gap of a predetermined size is formed between the silicon wafer and the second susceptor portion, and so that another gap of a size substantially equal to the predetermined size and directly connected to the above gap is formed between the first susceptor portion and the second susceptor portion.

7 Claims, 7 Drawing Sheets

(56) References Cited

FOREIGN PATENT DOCUMENTS

| JP | 2006-237516 | 9/2006 |
|---|---|---|
| KR | 10-2009-0036722 | 4/2009 |
| TW | 200416839 | 9/2004 |
| TW | 200733202 | 9/2007 |

OTHER PUBLICATIONS

Notification of Reasons for Refusal issued by the Japanese Patent Office on Aug. 30, 2011, for Japanese Patent Application No. 2009-156809, and English-language translation thereof.

Notification of Reasons for Refusal issued by the Japanese Patent Office on Jan. 31, 2012, for Japanese Patent Application No. 2009-156809, and English-language translation thereof.

Examination Opinion Notice issued by the Taiwanese Intellectual Property Office on Feb. 6, 2013, for Taiwanese Patent Application No. 099121065, and English-language translation thereof.

$2^{nd}$ Notification of Reasons for Refusal issued by the Chinese Patent Office on Jan. 30, 2013, for Chinese Patent Application No. 201010220837.9, and English-language translation thereof.

* cited by examiner distance from the center of the silicon wafer (mm)

US 8,795,435 B2

SUSCEPTOR, COATING APPARATUS AND COATING METHOD USING THE SUSCEPTOR

CROSS-REFERENCE TO RELATED APPLICATION

The entire disclosure of a Japanese Patent Application No. 2009-156809, filed on Jul. 1, 2009 including specification, claims, drawings and summary, on which the Convention priority of the present application is based, are incorporated herein by reference in its entirety.

BACKGROUND OF THE INVENTION

1. Field of the Invention

The present invention relates to a susceptor and to a coating apparatus and coating method using the susceptor.

2. Background Art

Epitaxial growth techniques are used to manufacture semiconductor devices requiring a relatively thick crystalline coating or film, such as power devices, including IGBTs (Insulated Gate Bipolar Transistors).

In order to produce an epitaxial wafer having a considerable coating thickness with high yield, it is necessary to continuously bring a fresh supply of material gas into contact with the uniformly heated surface of the wafer and thereby increase the coating speed. To do this, it is common practice that the wafer is subjected to epitaxial growth while it is rotated at high speed (see, e.g., Japanese Laid-Open Patent Publication No. 5-152207 (1993)).

In the vapor deposition apparatus disclosed in the above publication, an annular susceptor for supporting the wafer is fitted into a susceptor support, and the rotary shaft coupled to the susceptor support is rotated to rotate the wafer. It should be noted that the inner side of the susceptor has a countersink to receive the peripheral portion of the wafer thereon. That is, only a very narrow peripheral portion of the bottom surface of the wafer is in contact with the susceptor, and the rest of the bottom surface directly faces the surface of the heat equalizing plate for heating the bottom surface of the wafer. This structure is disadvantageous in that the wafer might be contaminated with contaminants such as metal atoms originating from the heating unit and the rotary portion, resulting in degradation of the electrical characteristics of the formed epitaxial film.

Further, according to the above patent publication, the mixture of material gas and carrier gas introduced into the reaction chamber flows radially across the top surface of the wafer from the center portion to the peripheral portion of the top surface due to the centrifugal force generated by the rotation of the wafer, and eventually exits from the reaction chamber through the exhaust port. It has been found, however, that since the susceptor is annular in shape, part of the gas reaching the peripheral portion of the wafer flows through the gap between the peripheral portion and the susceptor to the opening of the susceptor, resulting in the formation of an epitaxial film between the wafer and the susceptor. This film acts to attach the wafer to the susceptor, which may cause a crystal defect called a "slip" in the wafer as well as hampering the transfer of the wafer. The slip acts to warp the wafer and generate a leakage in the IC device, thereby greatly reducing the yield of the IC device.

In order to solve this problem, a susceptor has been proposed which includes an annular first susceptor portion for supporting the peripheral portion of the wafer and a disc-like second susceptor portion closely fitted into the opening of the first susceptor portion. This susceptor can prevent the wafer from being contaminated by contaminants originating from the heating unit and the rotary portion, since the second susceptor portion completely stops up the opening of the first susceptor portion. Furthermore, it is possible to block the flow of mixed gas through the gap between the peripheral portion of the wafer and the susceptor.

Incidentally, when the wafer is being mounted on the above susceptor, part of the mixed gas is compressed between the wafer and the second susceptor portion. The increased pressure of this compressed mixed gas due to the weight of the wafer causes the wafer to be displaced from its predetermined position, although the gas eventually escapes from between the wafer and the second susceptor portion. Another problem arises when the bottom surface of the wafer is heated in order to form an epitaxial film on its top surface. That is, if the entire bottom surface of the wafer is in contact with the second susceptor portion, the wafer is warped concavely upward by the heat, which might prevent the film formation on the wafer while rotating the wafer.

To solve this problem, the peripheral portion of the wafer may be supported on the first susceptor portion, and a gap may be provided between the wafer and the second susceptor portion. This arrangement prevents displacement of the wafer from its predetermined position on the susceptor when the wafer is being mounted on the susceptor, as well as avoiding the problem of the wafer being warped concavely upward when it is heated. In this case, however, another problem arises, as described below.

FIG. 8 is a partial cross-sectional view schematically showing a peripheral portion of the wafer and the adjacent portion of the susceptor as described above. Referring to FIG. 8, a susceptor 302 includes a first susceptor portion 302a for supporting the peripheral portion of a silicon wafer 301 and a second susceptor portion 302b closely fitted into the opening of the first susceptor portion 302a. A gap 303 is provided between the silicon wafer 301 and the second susceptor portion 302b.

The susceptor 302 is heated by a heater (not shown) situated below it (as viewed in FIG. 8), and the silicon wafer 301 is heated by the heat from the susceptor 302. At that time, the peripheral portion of the silicon wafer 301 is heated by the heat from the first susceptor portion 302a since they are in contact with each other. The rest of the silicon wafer 301, on the other hand, is heated by the heat transferred from the second susceptor portion 302b through the ambient gas in the gap 303. It should be noted that the peripheral portion of the silicon wafer 301 is heated to a higher temperature than the rest of the silicon wafer 301 since the first susceptor portion 302a is made of SiC and hence has a lower thermal resistance than the ambient gas in the gap 303. Consequently, the temperature distribution across the silicon wafer 301 is not uniform and, hence, the thickness of the formed epitaxial film is not uniform. Further, thermal stress is concentrated at the points of contact between the silicon wafer 301 and the first susceptor portion 302a, which may result in breakage of the susceptor 302 and the formation of slips in the wafer.

The present invention has been made in view of the foregoing problems. It is, therefore, an object of the present invention to provide a susceptor constructed to be effective in reducing at least one of; the attachment of the wafer to the susceptor, contamination of the wafer with metal, and displacement of the wafer, or ensuring a uniform temperature distribution across the wafer, or both.

Another object of the present invention is to provide a coating apparatus and coating method capable of forming a film having a uniform thickness.

Other challenges and advantages of the present invention are apparent from the following description.

SUMMARY OF THE INVENTION

According to one aspect of the present invention, a susceptor on which a substrate is mounted when the substrate is subjected to predetermined processing, comprises an annular first susceptor portion for supporting a peripheral portion of the substrate, and a second susceptor portion provided in contact with a peripheral portion of the first susceptor portion and covering the opening of the first susceptor portion. The second susceptor portion is disposed so that, when the substrate is supported on the first susceptor portion, a first gap of a predetermined size is formed between the substrate and the second susceptor portion, and so that a second gap of a size substantially equal to the predetermined size and directly connected to the first gap is formed between the first and second susceptor portions.

According to another aspect of the present invention, a coating apparatus comprises a coating chamber into which a substrate is introduced, a susceptor disposed in the coating chamber and on which the substrate is mounted, and a heating unit for heating the substrate through the susceptor. The susceptor includes an annular first susceptor portion for supporting a peripheral portion of the substrate, and further includes a second susceptor portion provided in contact with a peripheral portion of the first susceptor portion and covering the opening of the first susceptor portion. The second susceptor portion has a concave portion facing the first susceptor portion. The second susceptor portion is disposed so that, when the substrate is supported on the first susceptor portion, a first gap of a predetermined size is formed between the substrate and the second susceptor portion, and so that a second gap of a size substantially equal to the predetermined size and directly connected to the first gap is formed between the first and second susceptor portions.

According to other aspect of the present invention, in a method of forming a predetermined film on a substrate in a coating chamber while heating the substrate, a peripheral portion of the substrate is supported by an annular first susceptor portion. A second susceptor portion is disposed so that the second susceptor portion is in contact with a peripheral portion of the first susceptor portion and covers the opening of the first susceptor portion, and so that, when the substrate is supported on the first susceptor portion, a first gap of a predetermined size is formed between the substrate and the second susceptor portion and a second gap of a size substantially equal to the predetermined size and directly connected to the first gap is formed between the first and second susceptor portions so as to be able to uniformly heat the substrate.

DETAILED DESCRIPTION OF THE EMBODIMENTS

Figure 1:
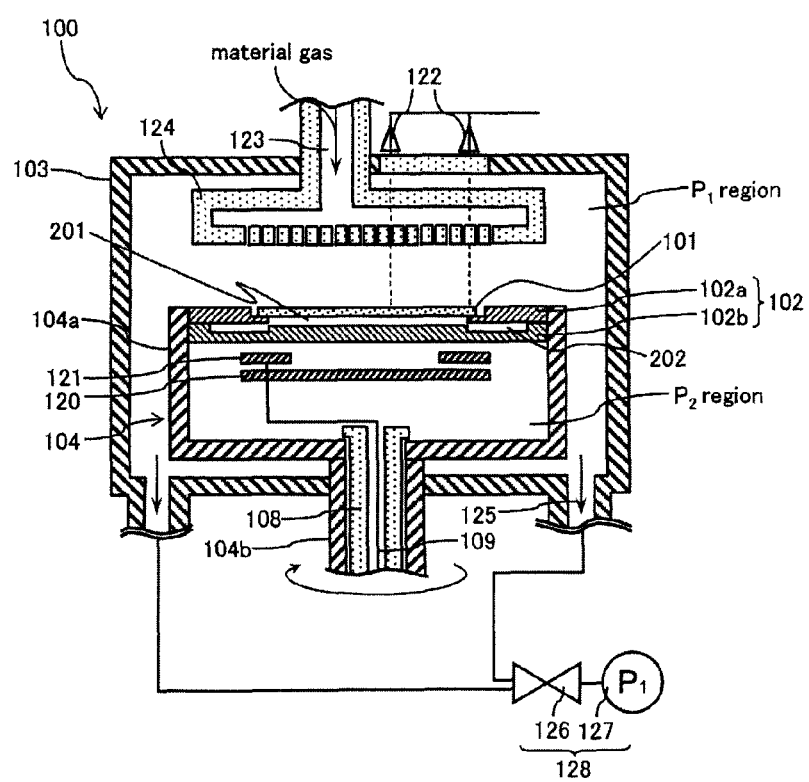
FIG. 1 is a schematic cross-sectional view of a coating apparatus according to an embodiment of the present invention.

FIG. 1 is a schematic cross-sectional view of a coating apparatus 100 of the single wafer processing type according to an embodiment of the present invention.

The substrate of the present embodiment described herein is a silicon wafer 101. However, the embodiment is not limited to this particular substrate, but may be applied to wafers of other suitable material depending on the application intended.

The coating apparatus 100 includes a chamber 103 serving as a coating chamber.

A gas supply portion 123 is provided at the top of the chamber 103 to supply a material gas to the surface of the silicon wafer 101 in a heated state to form a crystalline coating on the surface. Further, a shower plate 124 having a large number of material gas discharge holes formed therein is connected to the gas supply portion 123. The shower plate 124 is disposed to face the surface of the silicon wafer 101 to supply a material gas thereto.

A plurality of gas exhaust portions 125 are provided at the bottom of the chamber 103 to exhaust material gas from the chamber 103 after the gas is subjected to reaction. The gas exhaust portions 125 are coupled to an evacuating mechanism 128 made up of a regulating valve 126 and a vacuum pump 127. The evacuating mechanism 128 adjusts the pressure in the chamber 103 to a predetermined level under the control of a control mechanism (not shown).

In the chamber 103, a susceptor 102 of the present embodiment is disposed on a rotary portion 104. The susceptor 102 is made, e.g., of highly pure SiC, since it is subjected to high temperature.

The rotary portion 104 includes a cylindrical portion 104a and a rotary shaft 104b. The rotary shaft 104b is rotated by a motor, not shown, to rotate the susceptor 102 through the cylindrical portion 104a.

Referring to FIG. 1, the cylindrical portion 104a is open at its top but covered on top with the susceptor 102, thereby forming a hollow region (hereinafter referred to as the "P$_2$ region"). The space inside of the chamber 103 is referred to herein as the "P$_1$ region." The P$_2$ region is substantially isolated from the P$_1$ region by the susceptor 102.

An inner heater 120 and an outer heater 121, together serving as a heating unit, are provided in the P$_2$ region to heat the silicon wafer 101 by application of heat to its back surface through the susceptor 102. These heaters are powered through an electrical wire 109 which passes through the inside of a substantially cylindrical quartz shaft 108 extending within the hollow rotary shaft 104b.

A radiation thermometer 122 mounted at the top of the chamber 103 is used to measure the surface temperature of the silicon wafer 101, which temperature varies in response to the heat applied to the wafer. It should be noted that the shower plate 124 may be of transparent quartz so as not to interfere with the temperature measurement by the radiation thermometer 122. The measured temperature data is sent to a control mechanism, not shown, and then fed back to control the output of the inner and outer heaters 120 and 121. This allows the silicon wafer 101 to be heated to the desired temperature.

The rotary shaft 104b of the rotary portion 104 extends out of the chamber 103 and is coupled to a rotating mechanism (not shown). The susceptor 102, together with the silicon wafer 101 supported thereon, can be rotated by rotating the cylindrical portion 104a at a predetermined speed. The cylindrical portion 104a is preferably rotated about an axis passing perpendicular through the center of the silicon wafer 101.

Figure 2:
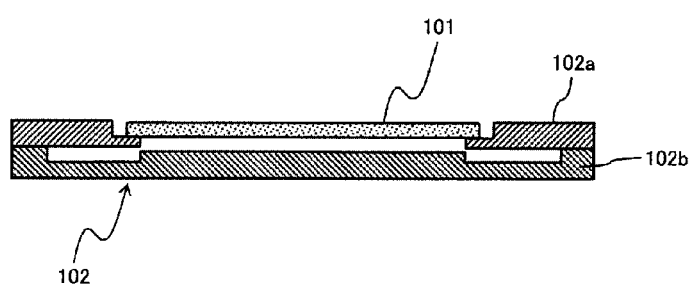
FIG. 2 is a cross-sectional view showing the susceptor and the silicon wafer mounted thereon.
Figure 3:
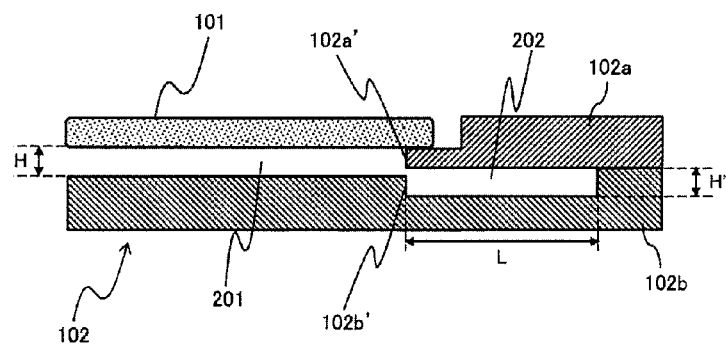
FIG. 3 is an enlarged view of a portion of the cross-sectional view of FIG. 2.

FIG. 2 is a cross-sectional view showing the susceptor 102 and the silicon wafer 101 mounted thereon. FIG. 3 is an enlarged view of a portion of the cross-sectional view of FIG. 2.

As shown in FIGS. 2 and 3, the susceptor 102 includes an annular first susceptor portion 102a for supporting the peripheral portion of the silicon wafer 101 and further includes a second susceptor portion 102b disposed in contact with the peripheral portion of the first susceptor portion 102a and covering the opening of the first susceptor portion 102a. The susceptor 102 is mounted in the chamber 103 such that the second susceptor portion 102b stops up the opening of the first susceptor portion 102a, as shown in FIG. 1, thereby preventing contamination of the silicon wafer 101 with contaminants originating in the $P_2$ region. Further, this construction can also prevent material gas from entering the $P_2$ region through the gap between the peripheral portion of the silicon wafer 101 and the susceptor 102. This avoids the formation of an epitaxial film between the silicon wafer 101 and the susceptor 102, thereby reducing the attachment of the silicon wafer 101 to the susceptor 102 and formation of slips in the wafer.

A gap 201 is provided between the silicon wafer 101 and the second susceptor portion 102b, as shown in FIG. 3. That is, since the second susceptor portion 102b has a concave portion facing the first susceptor portion 102a, the gap 201 of a predetermined size is formed between the silicon wafer 101 and the second susceptor portion 102b when the silicon wafer 101 is supported on the first susceptor portion 102a. This arrangement can prevent displacement of the silicon wafer 101 when the wafer is being mounted on the susceptor 102, as well as preventing the silicon wafer 101 from being warped concavely upward when the silicon wafer 101 is heated by applying heat to its back surface from the inner heater 120 and the outer heater 121 through the susceptor 102.

With the silicon wafer 101 mounted in place on the susceptor 102, not only can an epitaxial film having a predetermined uniform thickness be formed on the surface of the wafer, but also distortion of the wafer can be prevented during the formation of the film. Specifically, if the silicon wafer 101 is displaced from its predetermined position, the wafer might be thrown outward by the unbalanced centrifugal forces produced by the rotation of the wafer. On the other hand, when there is a gap between the silicon wafer 101 and the second susceptor portion 102b, such as the gap 201 shown in FIG. 3, the silicon wafer 101 is not displaced when it is being mounted on the susceptor 102, meaning that a film can be formed at the predetermined location on the silicon wafer 101. That is, the silicon wafer 101 is not thrown outward during the formation of the film.

In the susceptor 102, there is a gap 202 between the first susceptor portion 102a and the second susceptor portion 102b. The gap 202 is directly connected to the gap 201, that is, there is no separating wall (or barrier) between the gaps 201 and 202.

When the silicon wafer 101 is mounted on the susceptor 102, the peripheral portion of the silicon wafer 101 is in contact with the first susceptor portion 102a, as shown in FIG. 1. In this state the silicon wafer 101 is heated by applying heat to its back surface from the inner heater 120 and the outer heater 121 through the susceptor 102. In this heating by the inner heater 120 and the outer heater 121, the second susceptor portion 102b of the susceptor 102 is the first to heat up, since the susceptor 102 is constructed such that the annular first susceptor portion 102a supports the peripheral portion of the silicon wafer 101 and that the second susceptor portion 102b is in contact with the peripheral portion of the first susceptor portion 102a and covers the opening of the first susceptor portion 102a. The silicon wafer 101 is then heated up by the heat transferred from the second susceptor portion 102b through the ambient gas in the gaps 201 and 202 and through the first susceptor portion 102a. The manner in which the silicon wafer 101 is heated will be described in more detail below.

The silicon wafer 101, except for its peripheral portion, is heated by the heat transferred from the second susceptor portion 102b through the ambient gas in the gap 201. The peripheral portion of the silicon wafer 101, on the other hand, is heated by the heat from the first susceptor portion 102a, since they are in contact with each other. More specifically, since there is the gap 202 between the first susceptor portion 102a and the second susceptor portion 102b, the peripheral portion of the silicon wafer 101 is heated by the heated second susceptor portion 102b through the first susceptor portion 102a in the following two ways.

The silicon wafer 101 is heated by the heat passing from the second susceptor portion 102b through the ambient gas in the gap 202 and then through the first susceptor portion 102a to the wafer. Further, the silicon wafer 101 is also heated by the heat passing from the second susceptor portion 102b through the points of contact between the first and second susceptor portions 102a and 102b and then through the first susceptor portion 102a to the wafer. In either way, the silicon wafer 101 is heated by the heat transferred through the points of contact between the first susceptor portion 102a and the peripheral portion of the wafer. The construction shown in FIG. 3 is similar to that shown in FIG. 8 in this respect.

Figure 8:
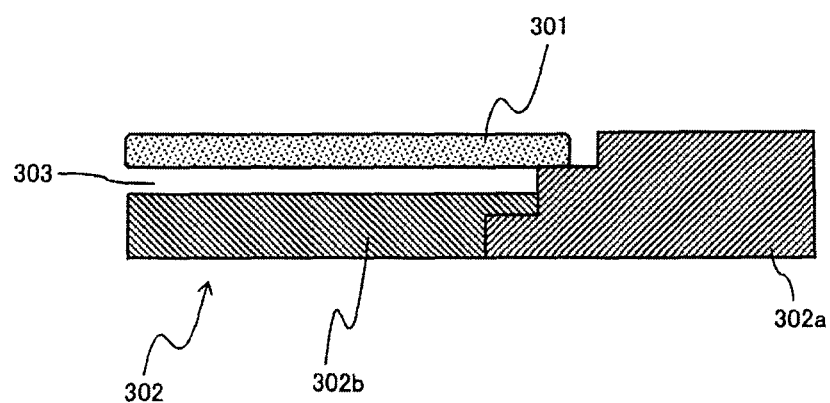
FIG. 8 is a portion of the cross-sectional view of silicon wafer when it is mounted on the conventional susceptor.

However, whereas in the example shown in FIG. 8 the first susceptor portion 302a is directly heated by the heater, in the construction of the present embodiment the second susceptor portion 102b is heated by the heater and then heat is transmitted from the heated second susceptor portion 102b to the first susceptor portion 102a. More specifically, in the construction of the present embodiment, the first susceptor portion 102a is heated by the heated second susceptor portion 102b in the following manner. The portion of the first susceptor portion 102a adjacent the peripheral portion of the silicon wafer 101 is heated by the heat from the heated ambient gas in the gap 202. On the other hand, the peripheral portion of the first susceptor portion 102a, which is away from the peripheral portion of the silicon wafer 101 and in contact with the second susceptor portion 102b, is heated by the heat conducted through the points of contact between the first susceptor portion 102a and the second susceptor portion 102b. That is, although the construction of the present embodiment is similar to that shown in FIG. 8 in that, when the susceptor is heated by the heater, the silicon wafer 101 is heated by the heat from the first susceptor portion 102a in contact with the peripheral portion of the wafer, the temperature of the portion of the first susceptor portion in contact with the peripheral portion of the silicon wafer is lower in the construction of the present embodiment than it is in the construction of FIG. 8. Further, in the construction of the present embodiment, there is no separating wall (or barrier) between the gaps 201 and 202, through which wall heat might be conducted from the second susceptor portion 102b to the first susceptor portion 102a and to the silicon wafer 101 resulting in a rise in the temperature of some particular part of the silicon wafer 101.

Referring to FIG. 3, the height H of the gap 201 is preferably substantially equal to the height H' of the gap 202. Since the ambient gas in these gaps has a higher heat resistance than SiC, their heights may be adjusted to adjust the temperature distribution across the silicon wafer 101. That is, the height H may be equal to the height H' to equalize the temperature distribution across the silicon wafer 101. Further, the heights H and H' may be equal and in the range of 0.6-0.8 mm. However, their actual values are preferably determined in accordance with the pressure in the chamber. Further, the temperature distribution across the silicon wafer 101 can also be adjusted by adjusting the length L of the gap 202 in the lateral direction. Specifically, the longer the length L, the smaller the amount of heat transferred to the peripheral portion of the silicon wafer 101 through the points of contact between the first and second susceptor portions 102a and 102b and through the first susceptor portion 102a, and hence the lower the temperature of the peripheral portion of the silicon wafer 101.

It should be noted that the first susceptor portion 102a and the second susceptor portion 102b of the susceptor 102 may be separately formed and assembled together. Alternatively, they may be integrally formed.

Figure 4:
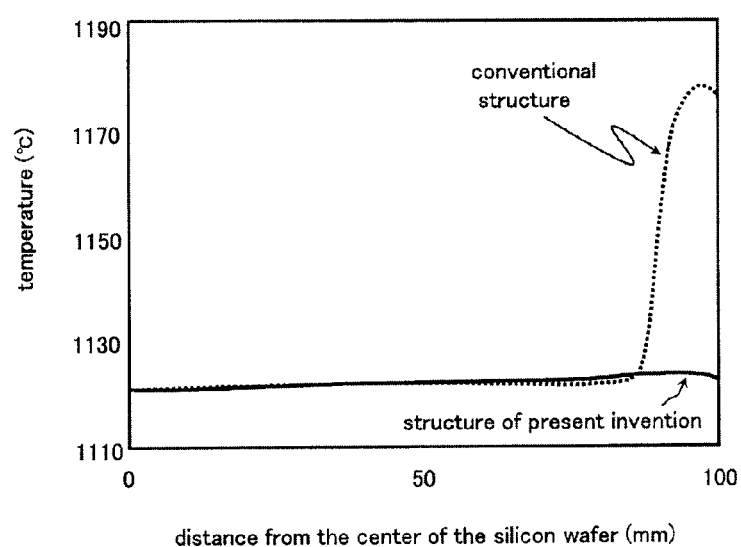
FIG. 4 shows an exemplary compared the temperature distribution across the silicon wafer when it is mounted on the susceptor of the present embodiment and when it is mounted on the conventional susceptor.

FIG. 4 shows heat transfer simulation results comparing the temperature distribution across the silicon wafer 101 when it is mounted on the susceptor (102) of the present embodiment and when it is mounted on the conventional susceptor (302) shown in FIG. 8. It will be noted that the horizontal axis presents the distance from the center of the silicon wafer and the vertical axis represents the temperature of the silicon wafer. As can be seen from FIG. 4, when the conventional susceptor is used, the temperature of the peripheral portion of the silicon wafer is significantly high, whereas when the susceptor of the present embodiment is used the temperature of the peripheral portion of the silicon wafer is not high, achieving a substantially uniform temperature distribution across the wafer.

Thus, in the susceptor 102, the second susceptor portion 102b is disposed so that, when the silicon wafer 101 is supported on the first susceptor portion 102a, the gap 201 of the predetermined size H is formed between the silicon wafer 101 and the second susceptor portion 102b, and so that the gap 202 directly connected to the gap 201 is formed between the first susceptor portion 102a and the second susceptor portion 102b. It should be noted that the size H' of the gap 202 is preferably substantially equal to the size H of the gap 201. In the case of the susceptor 102 constructed as described above, when the susceptor with the silicon wafer 101 mounted thereon is heated by the heater, the peripheral portion of the silicon wafer 101 is not heated to a significantly higher temperature than the rest of the silicon wafer 101, allowing the temperature distribution across the silicon wafer 101 to be equalized. Further, the peripheral portion of the silicon wafer 101 undergoes reduced thermal stress during the heating process, thus preventing the formation of slips in the silicon wafer 101.

Figure 5:
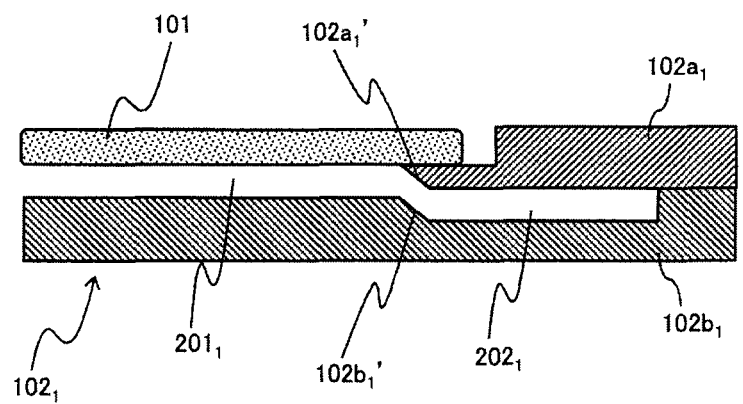
FIG. 5 shows an exemplary of susceptor of the present embodiment.

FIG. 5 is a partial cross-sectional view showing an end portion of another susceptor of the present embodiment and a portion of the silicon wafer mounted on the susceptor. It should be noted that the opposite end (not shown) of the susceptor also has the same configuration as that shown in FIG. 5.

The susceptor $102_1$ shown in FIG. 5 includes an annular first susceptor portion $102a_1$ for supporting the peripheral portion of the silicon wafer 101 and further includes a second susceptor portion $102b_1$ disposed in contact with the peripheral portion of the first susceptor portion $102a_1$ and covering the opening of the first susceptor portion $102a_1$. Further, a gap $201_1$ is provided between the silicon wafer 101 and the second susceptor portion $102b_1$, and a gap $202_1$ is provided between the first susceptor portion $102a_1$ and the second susceptor portion $102b_1$. Thus, this construction is similar to that of the susceptor 102 shown in FIG. 3.

However, in the susceptor 102, the edges 102a' and 102b' of the first susceptor portion 102a and the second susceptor portion 102b, respectively, that define the border between the gaps 201 and 202 are vertical in cross-section, whereas in the susceptor $102_1$ the edges $102a_1$' and $102b_1$' of the first susceptor portion $102a_1$ and the second susceptor portion $102b_1$, respectively, that define the border between the gaps $201_1$ and $202_1$ are tapered in cross-section.

As described above, in the susceptor 102 there is no separating wall (or barrier) between the gaps 201 and 202, through which wall heat might be conducted from the second susceptor portion 102b to the first susceptor portion 102a and to the silicon wafer 101 resulting in a rise in the temperature of some particular part of the silicon wafer 101. However, if the first susceptor portion 102a and the second susceptor portion 102b come out of alignment with each other so that they are very close to or in contact with each other, then the effect is as if a separating wall (or barrier) were provided between the gaps 201 and 202.

To avoid this problem, the edges $102a_1$' and $102b_1$' of the first susceptor portion $102a_1$ and the second susceptor portion $102b_1$, respectively, that define the border between the gaps $201_1$ and $202_1$ are tapered in cross-section, as shown in FIG. 5. The result is that misalignment between the first susceptor portion $102a_1$ and the second susceptor portion $102b_1$ does not result in a significant change in the distance between them.

It should be noted that the first susceptor portion $102a_1$ and the second susceptor portion $102b_1$ of the susceptor $102_1$ may be separately formed and assembled together. Alternatively, they may be integrally formed.

Figure 6:
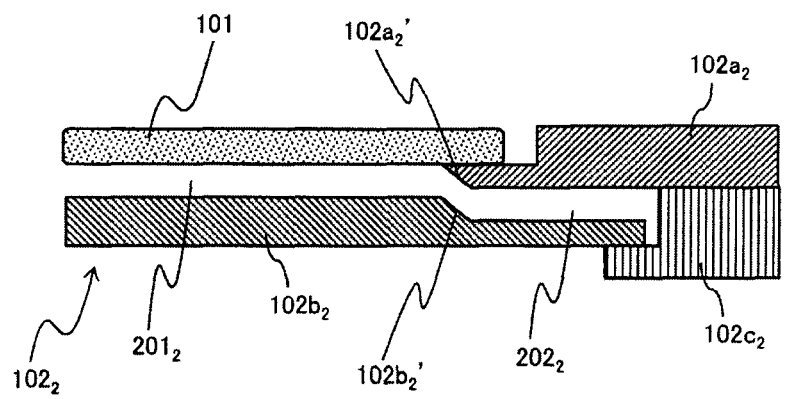
FIG. 6 shows an exemplary of susceptor of the present embodiment.

FIG. 6 is a partial cross-sectional view showing an end portion of still another susceptor of the present embodiment and a portion of the silicon wafer mounted on the susceptor. It should be noted that the opposite end (not shown) of the susceptor also has the same configuration as that shown in FIG. 6.

The susceptor $102_2$ shown in FIG. 6 includes: an annular first susceptor portion $102a_2$ for supporting the peripheral portion of the silicon wafer 101; a second susceptor portion $102b_2$ covering the opening of the first susceptor portion $102a_2$; and an annular third susceptor portion $102c_2$ having a larger opening than the opening of the first susceptor portion $102a_2$ and disposed in contact with the peripheral portion of the first susceptor portion $102a_2$ so as to support the peripheral portion of the second susceptor portion $102b_2$. Thus, the portion of the susceptor $102_2$ corresponding to the second susceptor portions shown in FIGS. 3 and 5 is divided into two smaller portions, one of which directly supports the first susceptor portion.

Specifically, the portion of the susceptor $102_2$ corresponding the second susceptor portions shown in FIGS. 3 and 5 is divided into a first part covering the opening of the first susceptor portion and an annular second part which has a larger opening than the opening of the first susceptor portion and which is disposed in contact with the peripheral portion of the first susceptor portion so as to support the peripheral portion of the first part. The first part corresponds to the second susceptor portion $102b_2$ shown in FIG. 6 and the second part corresponds to the third susceptor portion $102c_2$ shown in FIG. 6.

The susceptor $102_2$ shown in FIG. 6 is similar to the susceptors shown in FIGS. 3 and 5 in that a gap $201_2$ is provided between the silicon wafer 101 and the second susceptor portion $102b_2$ and a gap $202_2$ is provided between the first susceptor portion $102a_2$ and the second susceptor portion $102b_2$. It should be noted that although the edges $102a_2$' and $102b_2$' of the first susceptor portion $102a_2$ and the second susceptor portion $102b_2$, respectively, that define the border between the gaps $201_2$ and $202_2$ are shown in FIG. 6 to be tapered in cross-section, these edges may be vertical in cross-section, as in the susceptor shown in FIG. 3.

The second susceptor portions shown in FIGS. 3 and 5 are disadvantageous in that thermal stress may be concentrated around the portion of each second susceptor portion which supports the first susceptor portion and which borders on the gap between the first susceptor portion and the second susceptor portion. Further, if the second susceptor portion is thermally distorted and bowed, the resulting change in the distance between the silicon wafer and the second susceptor portion may prevent the equalization of the temperature distribution across the silicon wafer.

To avoid this problem, the portion of the susceptor $102_2$ corresponding to the second susceptor portions shown in FIGS. 3 and 5 is divided into two smaller portions, one of which directly supports the first susceptor portion. That is, as shown in FIG. 6, the susceptor $102_2$ includes: the annular first susceptor portion $102a_2$ for supporting the peripheral portion of the silicon wafer 101; the second susceptor portion $102b_2$ covering the opening of the first susceptor portion $102a_2$; and the annular third susceptor portion $102c_2$ having a larger opening than the opening of the first susceptor portion $102a_2$ and disposed in contact with the peripheral portion of the first susceptor portion $102a_2$ so as to support the peripheral portion of the second susceptor portion $102b_2$. In this construction, the portion of the susceptor $102_2$ corresponding to the second susceptor portions shown in FIGS. 3 and 5 is divided into two portions (i.e., the second susceptor portion $102b_2$ and the third susceptor portion $102c_2$) at the place where stress is likely to be concentrated, thus avoiding breakage of the susceptor $102_2$ due to the stress concentration at this location. Furthermore, the second susceptor portion $102b_2$ is less distorted or bowed (thermally, etc.) than the second susceptor portions shown in FIGS. 3 and 5, allowing the temperature distribution across the silicon wafer 101 to be further equalized.

Figure 7:
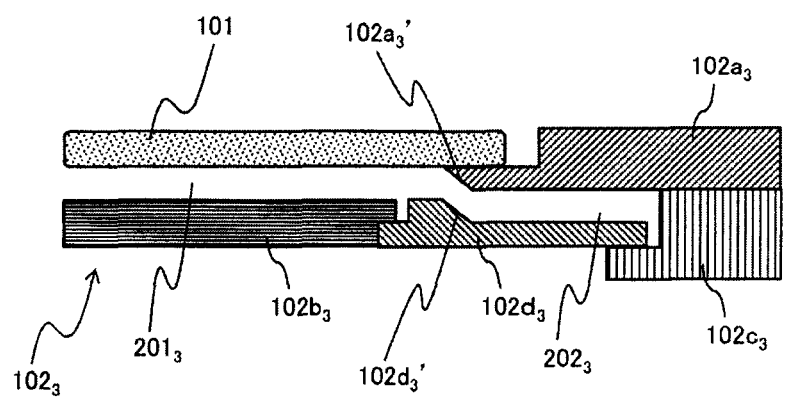
FIG. 7 shows an exemplary of susceptor of the present embodiment.

FIG. 7 is a partial cross-sectional view showing an end portion of still another susceptor of the present embodiment and a portion of the silicon wafer mounted on the susceptor. It should be noted that the opposite end (not shown) of the susceptor also has the same configuration as that shown in FIG. 7.

Referring to FIG. 7, the portion of a susceptor $102_3$ corresponding to the second susceptor portion $102b_2$ of the susceptor $102_2$ shown in FIG. 6 is divided at a point near the border between the gaps $201_2$ and $202_2$. More specifically, in the case of the susceptor $102_2$ of FIG. 6, the portion of the susceptor corresponding to the second susceptor portions shown in FIGS. 3 and 5 is divided into a first part (i.e., the second susceptor portion $102b_2$) covering the opening of the first susceptor portion and an annular second part (i.e., the third susceptor portion $102c_2$) having a larger opening than the opening of the first susceptor portion and disposed in contact with the peripheral portion of the first susceptor portion so as to support the peripheral portion of the first part, as described above. The susceptor $102_3$ shown in FIG. 7 differs from the susceptor $102_2$ shown in FIG. 6 in that the first part is divided into a third part covering the opening of the first susceptor portion and an annular fourth part supporting the third part and supported by the second part. The third part corresponds to the second susceptor portion $102b_3$ shown in FIG. 7 and the fourth part corresponds to the fourth susceptor portion $102d_3$ shown in FIG. 7.

Referring to FIG. 7, the susceptor $102_3$ includes: an annular first susceptor portion $102a_3$ for supporting the peripheral portion of the silicon wafer 101; the second susceptor portion $102b_3$ covering the opening of the first susceptor portion $102a_3$; an annular third susceptor portion $102c_3$ having a larger opening than the opening of the first susceptor portion $102a_3$ and disposed in contact with the peripheral portion of the first susceptor portion $102a_3$; and the annular fourth susceptor portion $102d_3$ supporting the second susceptor portion $102b_3$ and supported by the third susceptor portion $102c_3$.

In the case of the susceptor $102_3$, a gap $201_3$ is provided between the silicon wafer 101 and the second susceptor portion $102b_3$, and a gap $202_3$ is provided between the first susceptor portion $102a_3$ and the fourth susceptor portion $102d_3$. It should be noted that although the edges $102a_3$' and $102d_3$' of the first susceptor portion $102a_3$ and the fourth susceptor portion $102d_3$, respectively, that define the border between the gaps $201_3$ and $202_3$ are shown in FIG. 7 to be tapered in cross-section, these edges may be vertical in cross-section, as in the susceptor shown in FIG. 3.

As described above, in the case of the susceptor $102_2$ constructed as shown in FIG. 6, the portion of the susceptor corresponding to the second susceptor portions shown in FIGS. 3 and 5 is divided into two portions at the place where stress is likely to be concentrated, resulting in reduced stress. Further, in the case of the susceptor $102_3$ constructed as shown in FIG. 7, the portion of the susceptor corresponding to the second susceptor portions shown in FIGS. 3 and 5 is subjected to even less stress than the corresponding portion of the susceptor $102_2$. Specifically, as shown in FIG. 7, the portion of the susceptor $102_3$ corresponding to the second susceptor portion $102b_2$ shown in FIG. 6 is divided at a point near the border between the gaps $201_3$ and $202_3$. As a result, the susceptor $102_3$ is subjected to less stress than the susceptor $102_2$ shown in FIG. 6, since the susceptor $102_3$ is less susceptible to heat distortion. Further, the construction of FIG. 7 facilitates a stable transfer of the wafer. For example, referring to FIGS. 1 and 7, lifting pins may be provided in the rotary portion 104 shown in FIG. 1 and moved as follows: These lifting pins are raised from their lower position so as to support and lift the second susceptor portion $102b_3$ from the fourth susceptor portion $102d_3$. The pins are then further raised to raise the second susceptor portion $102b_3$ so that the lower surface of the silicon wafer 101, which has been previously transferred into the chamber 103, is supported on the second susceptor portion $102b_3$. The lifting pins are then lowered with the second susceptor portion $102b_3$ supported thereon so that the second susceptor portion $102b_3$ is returned to its initial position. Thus, the construction shown in FIG. 7 allows the silicon wafer 101 to be held on the second susceptor portion $102b_3$ when the wafer is being mounted on the susceptor. This enables the silicon wafer 101 to be easily and stably mounted at the desired location on the susceptor $102_3$ so that the wafer can be subjected to a deposition process.

In the susceptors of the present embodiment described above, a gap is provided between the first susceptor portion and the second susceptor portion (or, in the example shown in FIG. 7, between the first susceptor portion and the fourth susceptor portion). Therefore, although the peripheral portion of the wafer is in contact with the first susceptor portion and is heated by the heat therefrom, the temperature of the contacting portion of the first susceptor portion is lower than that in the conventional construction. As a result, the peripheral portion of the wafer is not heated to a significantly higher temperature than the rest of the wafer, allowing the temperature distribution across the wafer to be equalized. This also results in reduced thermal stress concentration at the points of contacts between the wafer and the first susceptor portion, thus reducing the possibilities of breakage of the susceptor and the formation of slips in the wafer.

In short, the susceptors of the present embodiment are constructed to be effective in reducing the attachment of the wafer to the susceptor, contamination of the wafer with metal, and displacement of the wafer, as well as ensuring a uniform temperature distribution across the wafer.

Further, the coating apparatus of the present embodiment, which is adapted to use the susceptors described above, can form a film having a uniform thickness on a wafer while reducing the formation of slips in the wafer.

An exemplary coating method of the present embodiment will now be described with reference to FIG. 1. This coating method allows for the formation of a film having a uniform thickness on a wafer while reducing the formation of slips in the wafer. Although this method will be described in connection with the susceptor 102, it is to be understood that the method can also be applied to the susceptors $102_1$, $102_2$, and $102_3$.

First, the silicon wafer 101 is mounted on the susceptor 102, as shown in FIG. 2. Specifically, the peripheral portion of the silicon wafer 101 is supported on the annular first susceptor portion 102a, and the second susceptor portion 102b is disposed so that the second susceptor portion 102b is in contact with the peripheral portion of the first susceptor portion 102a and covers the opening of the first susceptor portion 102a, and so that a gap 201 of a predetermined size H is formed between the silicon wafer 101 and the second susceptor portion 102b and a gap 202 of a size H' substantially equal to the predetermined size H and directly connected to the gap 201 is formed between the first susceptor portion 102a and the second susceptor portion 102b so as to be able to uniformly heat the silicon wafer 101. Next, the rotary portion 104 is rotated to rotate the silicon wafer 101 at a speed of approximately 50 rpm while introducing hydrogen gas into the chamber under a reduced pressure of e.g., a few tens of Torr.

The silicon wafer 101 is then heated to a temperature in the range of 100-1200° C. by the inner heater 120 and the outer heater 121. More specifically, for example, the wafer is gradually heated to a deposition temperature of 1150° C.

After the temperature of the silicon wafer 101 reaches 1150° C. as measured by the radiation thermometer 122, the speed of rotation of the silicon wafer 101 is gradually increased. A material gas is then supplied from the gas supply unit 123 into the chamber 103 through the shower plate 124. According to the present embodiment, the material gas may be trichlorosilane, and a mixture of the material gas and hydrogen gas (serving as a carrier gas) may be introduced from the gas supply unit 123 into the chamber 103.

The material gas introduced into the chamber 103 flows toward the silicon wafer 101, and more specifically it flows from above and down toward the silicon wafer 101. A fresh supply of material gas is continuously introduced from the gas supply unit 123 to the shower plate 124 and applied to the silicon wafer 101 while maintaining the silicon wafer 101 at a temperature of 1150° C. and rotating the susceptor 102 at a high speed of 900 rpm or more. This allows an epitaxial film to be efficiently deposited at a high speed.

By rotating the susceptor 102 while introducing material gas in this manner it is possible to grow a silicon epitaxial layer having a uniform thickness on the silicon wafer 101. For power semiconductor applications for example, a thick film having a thickness of 10 μm or more (typically approximately 10-100 μm) is formed on a silicon wafer having a thickness of 300 mm. In order to form a thick film on a substrate, the substrate is preferably rotated at a high speed, e.g., approximately 900 rpm, as in the above example.

It should be noted that any suitable known method may be used to transfer the silicon wafer 101 into and out of the chamber 103.

For example, when the susceptor 102 shown in FIG. 3 is used and the first susceptor portion 102a and the second susceptor portion 102b are integral with each other, the silicon wafer 101 may be transferred by utilizing the Bernoulli effect. Specifically, for example, a "holding" gas may be ejected so that the gas flows radially across the back surface of the silicon wafer from the center portion to the peripheral portion of the back surface. This creates a Bernoulli effect, enabling the silicon wafer to be floatingly held in place. It will be noted that this method can also be applied to the susceptor $102_1$ shown in FIG. 5 if the first susceptor portion $102a_1$ and the second susceptor portion $102b_1$ are integral with each other.

Further, the following method may be used to transfer the silicon wafer 101 when the susceptor shown in FIG. 7 is used.

Referring to FIG. 1, first the silicon wafer 101 is transferred into the chamber 103 by a transfer robot (not shown). It should be noted that, in this example, lifting pins (not shown) are provided in the rotary portion 104 so that they extend through the inside of the rotary shaft 104b. These lifting pins are then raised from their lower position so as to support and lift the second susceptor portion $102b_3$ from the fourth susceptor portion $102d_3$. The pins are then further raised to raise the second susceptor portion $102b_3$ so that the lower surface of the silicon wafer 101 held by the transfer robot is supported on the second susceptor portion $102b_3$. It should be noted that the second susceptor portion $102b_3$ may have a plurality of protrusions (not shown) on its surface facing the silicon wafer 101 so that the wafer can be supported on these protrusions. Next, the transfer robot releases the silicon wafer 101, so that the silicon wafer 101 is supported only by the second susceptor portion $102b_3$. After thus transferring the silicon wafer 101 to the second susceptor portion $102b_3$, the transfer robot (or robot arm) is retracted from the chamber 103. Next, the lifting pins are lowered with the second susceptor portion $102b_3$ supported thereon while holding the received silicon wafer 101 on the second susceptor portion $102b_3$. The pins are then further lowered so that the second susceptor portion $102b_3$ is returned to its initial position. Thus, the silicon wafer 101 can be mounted at the desired location on the susceptor $102_3$ so that the wafer can be subjected to a deposition process. After the completion of the deposition process, the reverse of the above procedure is followed to transfer the silicon wafer 101 from the second susceptor portion $102b_3$ to the transfer robot, which then transfers the wafer out of the chamber 103.

When the susceptor shown in FIG. 3 or 5 is used and the first susceptor portion and the second susceptor portion are not integral with each other, or when the susceptor shown in FIG. 6 is used, the silicon wafer 101 may be transferred to and from the transfer robot by raising and lowering the lifting pins with the first susceptor portion mounted thereon.

The features and advantages of the present invention may be summarized as follows.

In accordance with the embodiment of the present invention, there are provided susceptors constructed to be effective in reducing the attachment of the wafer to the susceptor, contamination of the wafer with metal, and displacement of the wafer, as well as ensuring a uniform temperature distribution across the wafer.

In accordance with the embodiment of the present invention, there is also provided a coating apparatus capable of forming a film having a uniform thickness on a wafer while reducing the formation of slips in the wafer.

In accordance with the embodiment of the present invention, there is also provided a growing method which is, like the coating apparatus of the embodiment, capable of forming a film having a uniform thickness on a wafer while reducing the formation of slips in the wafer.

The features and advantages of the present invention may be summarized as follows.

For example, although in the above embodiment a film is deposited on a silicon wafer while rotating the wafer, it is to be understood that the film may be deposited on the silicon wafer while holding the wafer stationary.

Further, although the coating apparatus of the present embodiment has been described with reference to an epitaxial growth apparatus, it is to be understood that the present invention is not limited to this particular apparatus, but can also be applied to CVD and other deposition apparatuses for forming a film on the surface of a wafer placed in a coating chamber by introducing a reactant gas into the chamber and heating the wafer.

What is claimed is:

1. A susceptor on which a substrate is mounted when said substrate is subjected to predetermined processing, said susceptor comprising:
   an annular first susceptor portion for supporting a peripheral portion of said substrate; and
   a second susceptor portion provided in contact with a peripheral portion of said first susceptor portion and covering an opening of said first susceptor portion;
   wherein said second susceptor portion is disposed so that, when said substrate is supported on said first susceptor portion, a first gap of a predetermined size is formed between said substrate and said second susceptor portion, and so that a second gap of said predetermined size and directly connected to said first gap is formed between said first and second susceptor portions;
   wherein said second susceptor portion is divided into a first part covering said opening of said first susceptor portion and an annular second part having a larger opening than said opening of said first susceptor portion, said second part being in contact with said peripheral portion of said first susceptor portion and supporting a peripheral portion of said first part; and
   wherein a first edge of said first susceptor portion and a second edge of said first part of said second susceptor portion that define a border between said first gap and said second gap are tapered in cross-section, respectively, and wherein the border is formed so that an inclined surface of the first edge and an inclined surface of the second edge face each other.

2. The susceptor according to claim 1, wherein said first part is divided into a third part covering said opening of said first susceptor portion and an annular fourth part supporting said third part and supported by said second part.

3. The susceptor according to claim claim 1, wherein said second gap extends toward an outside of a portion of the first susceptor on which the wafer is mounted.

4. A coating apparatus comprising:
   a coating chamber into which a substrate is introduced;
   a susceptor disposed in said coating chamber and on which said substrate is mounted; and
   a heating unit for heating said substrate through said susceptor;
   wherein said susceptor includes an annular first susceptor portion for supporting a peripheral portion of said substrate and further includes a second susceptor portion provided in contact with a peripheral portion of said first susceptor portion and covering an opening of said first susceptor portion;
   wherein said second susceptor portion has a concave portion facing said first susceptor portion; and
   wherein said second susceptor portion is disposed so that, when said substrate is supported on said first susceptor portion, a first gap of a predetermined size is formed between said substrate and said second susceptor portion, and so that a second gap of said predetermined size and directly connected to said first gap is formed between said first and second susceptor portions;
   wherein said second susceptor portion is divided into a first part covering said opening of said first susceptor portion and an annular second part having a larger opening than said opening of said first susceptor portion, said second part being in contact with said peripheral portion of said first susceptor portion and supporting a peripheral portion of said first part; and
   wherein a first edge of said first susceptor portion and a second edge of said first part of said second susceptor portion that define a border between said first gap and said second gap are tapered in cross-section, respectively, and wherein the border is formed so that an inclined surface of the first edge and an inclined surface of the second edge face each other.

5. The coating apparatus according to claim 4, wherein said first part is divided into a third part covering said opening of said first susceptor portion and an annular fourth part supporting said third part and supported by said second part.

6. The coating apparatus according to claim 4, wherein:
   said coating chamber is constructed so that gas is externally introduced into said coating chamber and flows from above and down toward said substrate; and
   said susceptor is rotatable at 900 rpm or more with said substrate mounted thereon.

7. The coating apparatus according to claim 4, wherein said second gap extends toward an outside of a portion of the first susceptor on which the wafer is mounted.

* * * * *